United States Patent [19]

Kanayama et al.

[11] Patent Number: 4,815,850

[45] Date of Patent: Mar. 28, 1989

[54] RELATIVE-DISPLACEMENT MEASUREMENT METHOD

[75] Inventors: Toshihiko Kanayama; Junji Itoh, both of Niihari, Japan

[73] Assignee: Agency of Industrial Science and Technology, Tokyo, Japan

[21] Appl. No.: 7,378

[22] Filed: Jan. 27, 1987

[30] Foreign Application Priority Data

Jan. 27, 1986 [JP] Japan .................................. 61-15368

[51] Int. Cl.[4] .............................................. G01B 9/02
[52] U.S. Cl. ..................................... 356/349; 356/356
[58] Field of Search ................. 356/349, 355, 346, 401

[56] References Cited

U.S. PATENT DOCUMENTS

| | | |
|---|---|---|
| 3,726,595 | 4/1973 | Matsumoto . |
| 4,211,489 | 7/1980 | Kleinknecht et al. .......... 356/356 X |
| 4,332,473 | 6/1982 | Ono ..................................... 356/356 |
| 4,422,763 | 12/1983 | Kleinknecht ....................... 356/356 |
| 4,656,347 | 4/1987 | Une et al. ........................ 356/356 X |
| 4,710,026 | 12/1987 | Magome et al. .................... 356/349 |

FOREIGN PATENT DOCUMENTS

| | | |
|---|---|---|
| 0146244 | 6/1985 | European Pat. Off. . |
| 2316248 | 10/1974 | Fed. Rep. of Germany . |
| 3316144 | 10/1983 | Fed. Rep. of Germany . |
| 3304194 | 6/1986 | Fed. Rep. of Germany . |

OTHER PUBLICATIONS

Experimental Evaluation of Interferometric . . . Registration.
A Dual Grating Alignment Technique for X-ray Lithography.
A New Interferometric Alignment Technique with Holographic Configuration.
Diffraction Gratings as Keys for Automatic Alignment in Proximity and Projection Printing.
Y. Ohtsuka, M. Tsubokawa, "Dynamic Two-Frequency Interferometry for Small Displacement Measurements" 2/84, pp. 25–29 of Optics and Laser Technology.
Flanders et al., "A New Interferometric Alignment Technique" *Appl. Phys. Lett.*, vol. 31, No. 7, pp. 426–427, 10/77.

*Primary Examiner*—Davis L. Willis
*Assistant Examiner*—Matthew W. Koren
*Attorney, Agent, or Firm*—Cushman, Darby & Cushman

[57] ABSTRACT

A relative displacement among a plurality of objects is measured with a high degree of accuracy by utilizing diffraction and interference phenomena of waves through diffraction gratings formed on the objects. Forming diffraction gratings on a plurality of objects, aligned or registered with each other, a wave is made incident to the diffraction gratings, thereby diffracted waves are obtained. A phase difference of the diffracted waves is measured. As a result, relative-displacements among the plurality of objects are obtained with a high degree of accuracy.

19 Claims, 9 Drawing Sheets

RELATIVE-DISPLACEMENT MEASUREMENT METHOD

BACKGROUND OF THE INVENTION

1. Field of the Invention

The present invention relates to a method for measuring relative displacements among a plurality of objects with a high degree of accuracy by utilizing diffraction and interference phenomena of waves through diffraction gratings formed on the objects.

2. Description of the Prior Art

As a prior art, a method for measuring a relative displacement by utilizing diffraction gratings disclosed by Flanders et al. in Applied Phisics Letters 31,426 (1977) will be described with reference to FIG. 1. Diffraction gratings G1 and G2 having the same period d are formed on two objects 1 and 2, respectively, and are spaced apart from each other in parallel with each other. When the wave I is vertically incident to the diffraction grating G1, it is diffracted by an angle $\theta$ (d sin $\theta = n\lambda$, where n is an integer representing the order of diffraction) which is dependent upon the period d and the wavelength $\lambda$ of the wave I. An intensity of the diffracted waves varies in response to a relative position between the diffraction gratings G1 and G2 so that the relative displacement between the objects 1 and 2 or between the diffraction gratings G1 and G2 can be measured by measuring the intensity of the diffracted waves.

Especially, since intensities of the diffracted waves D+ in the +$\theta$ direction and those D− in the −$\theta$ direction varies in the opposite directions in response to the relative displacement in the direction (X direction) perpendicular to the grating within the surface thereof, so that in principle it becomes possible to measure the relative displacement in the X direction by measuring the difference in intensity between two diffracted waves I(D+)-I(D−).

However, the method described above with reference to FIG. 1 has defects so that it cannot be satisfactorily applied in practice because of the reasons described below. First, D+ and D− consist of many diffracted waves as shown in FIG. 1. The wave which is diffracted at the i-th order by the diffraction grating G1, diffracted at the j-th order by the diffraction grating G2 and further diffracted at the k-th order by the diffraction grating G1 is designated by D(i,j,k) while the wave which is reflected and diffracted at the i-th order on the upper surface of the diffraction grating G1 is designated by R(i). Then in the case of the first order diffraction, D+ is a mixed wave of diffracted waves R(1) and D(i,j,k) (where i+j+k=1) such as D(0,0,1), D(0,1,0), D(1,0,0), D(0,−1,2), D(−1,0,2) and so on. For the sake of simplicity, FIG. 1 only shows R(1), D(−1,1,1), D(0,0,1), D(1,−1,1) and D(1,0,0). The dependence of these diffracted waves on the relative displacement in the X direction of the gratings and on the distance S between the diffraction gratings G1 and G2 vary depending upon their diffraction orders. Thus, the intensities of D+ and D− are a complicated function of the relative displacement in the X direction and the distance S so that the measurement of the relative displacement in the X direction by the measurement of the difference between I(D+) and I(D−) is limited within an extremely limited range of the distance S.

Furthermore, if there exist differences in characteristics between the instruments for measuring the intensities of D+ and D−, the measured relative displacement includes errors. It follows therefore that in order to improve the accuracy of measurement, the characteristics of the instruments for measuring the intensities of D+ and D− must be made to strictly coincide with each other. As a result, the measurement with a high degree of accuracy becomes difficult.

FIG. 2 shows a measurement method capable of measuring the relative displacement without depending on the distance S, which is proposed by the present inventor and is disclosed in the Japanese Patent Application No. 60-165231. According to this method, two diffraction gratings G1 and G1' are formed on the object 1 and are spaced apart from each other by a suitable distance so that only the diffracted waves in the specific orders are incident on the diffraction grating G2 of the object 2, whereby the strong dependence of the intensity of the diffracted wave D from the diffraction grating G2 on the distance S between the diffraction gratings G1 and G2 is eliminated. Therefore, the relative displacement in the X direction can be measured by measuring the intensity of the diffracted light D by a detector 3 without being limited by the range of the distance S.

However, the above-described method also has the following defects so that it can not be satisfactorily used in practice. First, the intensity I(D) of the diffracted wave D depends on the displacement x in the x direction in proportion to $\cos^2(2\pi x/d)$ (where d is the period of G1). But, the absolute value of I(D) is influenced by various factors so that it is impossible to theoretically estimate. It follows therefore in order to obtain x from the intensity I(D), the variation in I(D) must be measured while X is varied in the range of about d/4 in practice. Another defect of the above-described method is that since the intensity of the diffracted wave is used as a signal representative of a displacement (a displacement signal), the measurement result is easily adversely affected very often by the variations of characteristics of the measurement instrument. Furthermore, the intensity of the diffracted wave incident to the diffraction grating G2 from the diffraction gratings G1 and G1' varies in response to the variation in S so that the above-described measurement method has a further defect that the variation in S during the measurement process cannot be permitted, if it is desired to measure x with a high degree of accuracy.

SUMMARY OF THE INVENTION

In view of the above, the primary object of the present invention is to provide a method for substantially eliminating the above and other defects, whereby the relative displacement can be measured with a high degree of accuracy.

To the above and other ends, according to the present invention, at least one of a plurality of objects is formed with a diffraction grating so that the relative displacements among a plurality of objects can be measured by measuring the phase of the diffracted wave obtained by the diffraction through the diffraction grating in reference to another diffracted wave or an incident wave.

The present invention is based upon the underlying principle to be described below. The phase of the wave which is diffracted by the diffraction grating formed on the first object and then reflected from the second object or diffracted by the diffraction grating formed thereon, and the phase of the wave which is reflected by the first object and then diffracted by the diffraction grating formed on the second object vary with the relative position between the first and second objects. It follows therefore that the relative displacement between the two objects can be obtained by measuring the phase of the diffracted wave in reference to an incident wave or another diffracted wave having different dependence of the phase on the relative displacement.

The prior art measuring methods measure the relative displacement between two objects based on the fact that the intensity of the diffracted wave varies in response to the relative displacement between the two objects. However, the intensity of the diffracted wave is easily influenced not only by the relative displacement to be measured but also by other various factors such as the condition under which two diffraction gratings are registered, the angle between the two diffraction gratings, the angle between the detector and the diffraction grating, the intensity of incident wave and so on. On the other hand, the phase of the diffracted wave is a quantity which is fundamentally determined by the distance of the passage of the wave so that it is hardly influenced by the above-described factors influencing the intensity of the diffracted wave. Therefore, according to the present invention, the relative displacement can be measured in a stable manner essentially with a high degree of accuracy without being affected by the external disturbances. Because of the same reason the conditions for measurements can be relaxed and the measurable range can be increased. Furthermore, when the frequency is less than tens GHz, it becomes easy to measure the phase of the wave at an accuracy higher than 1° so that the phase measurement can be made with a higher degree of accuracy than the intensity measurement.

However, when the frequency of the wave used for measurement becomes in excess of tens GHz, it becomes difficult to measure the phase with a high degree of accuracy. In order to solve this problem, the wave whose frequency is slightly different from that of the wave used for measurement and which can interfere with the latter measuring wave is provided, and these two waves are interfered with each other so that resulting beats are obtained a phase difference between the bear is measured. Such heterodyne measurement in which the beat between two waves having different wavelengthes is especially effective in the case of the relative displacement measurement utilizing the diffraction gratings because when the method for making two waves incident to the diffraction grating is suitably devised, the beat signal can be obtained without requiring additional component parts. When the measurement instrument is designed and constructed in the manner described above, the phase of the beat signal is hardly dependent upon the distance between the diffraction grating and the detector. As a result, the measurement system can be adjusted very easily and the stability against the external disturbances can be improved.

When two different waves for the measurement, which have different frequencies, are the electromagnetic waves polarized in different directions respectively, the incidence method can be remarkably simplified by utilizing the fact that diffraction efficiency attained by the diffraction grating and the reflectivity at the object are different depending upon the direction of polarization of the electromagnetic wave. In this case, it is not necessary to separate the two electromagnetic waves from each other but they may be focused as a single beam so that the beat signal required for the measurement can be obtained. An intense beat signal can be obtained when the polarization of the wave incident to the detector is controlled by a suitable polarizer. In this method, two waves used in the heterodyne measurement travel the completely same path so that the phase of the beat signal is almost independent from the distance between the wave source and the diffraction grating, and the distance between the diffraction grating and the detector As a result, the adjustment of the measuring system can be remarkably facilitated and the stability against the external disturbances can be significantly improved, whereby a high degree of reliability is ensured.

In the first aspect of the present invention, a relative-displacement measurement method comprises the steps of:

forming a diffraction grating on at least one of a plurality of objects;

making a wave incident to the diffraction grating, thereby obtaining diffracted waves;

measuring each of the diffracted waves;

a phase difference of the diffracted waves; and measuring relative displacements among the plurality of objects in response to the phase difference thus determined.

Here, diffraction gratings may be formed on each of the plurality of objects.

At least one of a plurality of waves which can interfere with each other, but are different in frequency from each other may be made incident to the diffraction grating; and phase difference in beats resulting from an interference among the plurality of waves may be measured, thereby obtaining the relative displacements among the plurality of objects based on the difference in beat phases thus measured.

A plurality of waves which can interfere with each other, but are different in frequency from each other may be made incident to the diffraction gratings; and phase difference in beats resulting from an interference among the plurality of waves may be measured, thereby obtaining the relative displacements among the plurality of objects based on the difference in beat phases thus measured.

The plurality of waves may be electromagnetic waves which are different in polarized state from each other.

The electromagnetic waves may be linearly polarized in different directions, respectively.

Two of three diffraction gratings may be formed on one object, and one of three diffraction gratings may be formed on the other object.

The three diffraction gratings may be arranged symmetrically.

A period of the diffraction grating formed on one object may be $j/2i$ times that of the diffraction grating formed on the other object, where $i$ and $j$ are plus integers.

The period of the diffraction grating formed on one object may be 1.5 times as that of the diffraction grating formed on the other object.

The electromagnetic waves may be transmitted through a polarizing beam splitter in such a way that the transmitted electromagnetic waves are made incident to the diffraction grating through a quarter-wave plate; a reflected light beam is radiated through a quarter-wave plate and a reflecting mirror to the polarizing beam splitter; and the diffracted light beam from the diffraction grating and the reflected light beam redirected to the polarizing beam splitter are combined and derived from the polarizing beam splitter, thereby detecting the phase difference.

The obtained diffracted wave may be made to pass through a polarizer so as to measure the phase difference in beats of the output light beam from the polarizer.

An optical system may be interposed between at least two adjacent ones of the plurality of objects.

The optical system may include a first lens, a second lens and a space filter disposed at a focal plane of the first lens.

The plurality of objects may be disposed in parallel with each other.

A relative-displacement measurement method according to the present invention may further comprise a step of measuring the phases difference in the beats of the diffracted waves, thereby determining a verticality of the wave incident in relation to the surface of the diffraction gratings.

In the second aspect of the present invention, a relative-displacement measurement method comprises the steps of:

forming a diffraction grating on one of two objects which are overlapped in parallel with each other;

causing the waves which are different in frequency and polarized state from each other, incident to the diffraction grating, thereby obtaining firstly diffracted waves;

making the firstly diffracted waves and/or waves passing through the diffraction grating incident to the other object not formed with a diffraction grating, thereby obtaining reflected light beams;

diffracting the reflected light beams by the diffraction grating, thereby obtaining the secondary diffracted waves; and measuring a phase of beat component of a combined wave of reflectively diffracted light beam of the wave incident to the diffraction grating and the firstly and secondary diffracted waves in reference to the beat formed by interference between the incident waves, thereby obtaining a distance between the two objects from the phase thus measured.

Here, the combined wave may be made to pass through a polarizer so as to obtain the phase of the beat of the output light beam therefrom.

The above and other objects, effects, features and advantages of the present invention will become more apparent from the following description of preferred embodiments thereof taken in conjunction with the accompanying drawings.

DETAILED DESCRIPTION OF PREFERRED EMBODIMENTS (First Embodiment 1)

Figure 2:
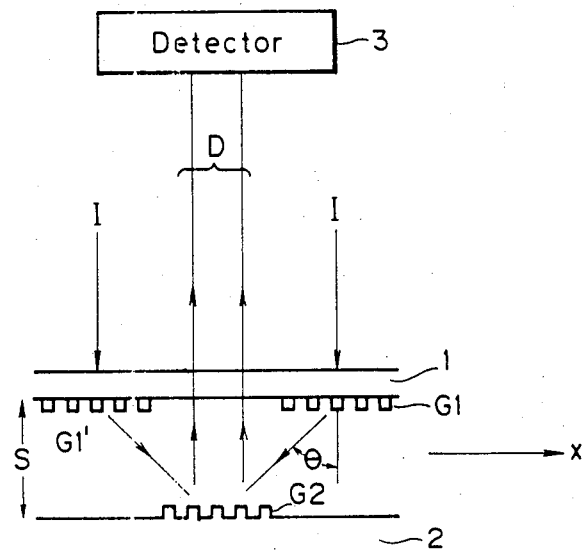
Figure 3A:
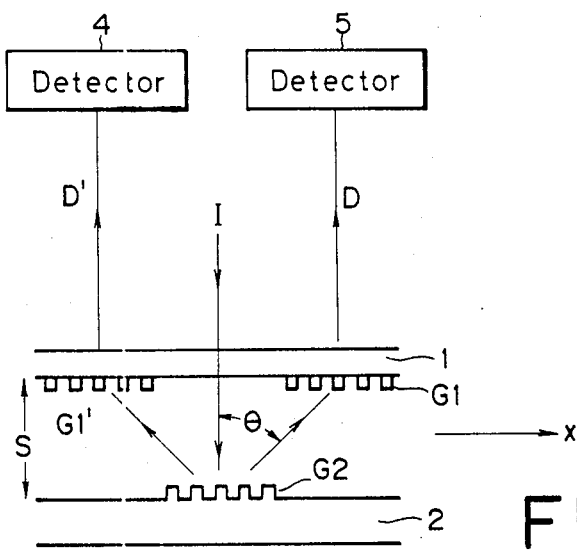
FIGS. 3A and 3B are schematic diagrams of a first and a second embodiment of the present invention, respectively.
Figure 3B:
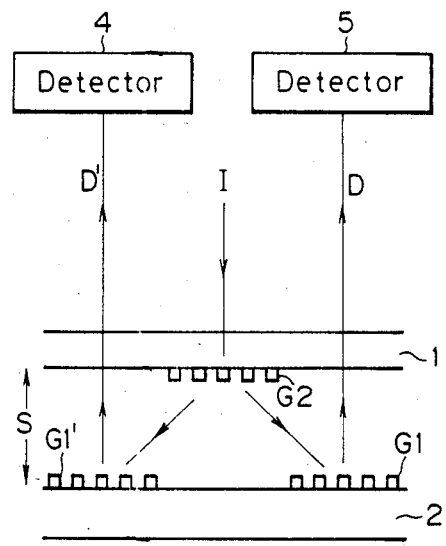

FIGS. 3A and 3B show first and second embodiments, respectively, in which the method of the present invention is applied to the method shown in FIG. 2. In the embodiment shown in FIG. 3A, two objects 1 and 2 are overlapped to each other. The object 2 is formed with a diffraction grating G2, to which a light wave I is incident vertically. The object 1 is formed with two diffraction gratings G1 and G1' at the positions on which are incident the diffracted waves from the diffraction grating G2. The diffraction gratings G1 and G1' have the same period d as the diffraction grating G2 and are maintained in parallel with the diffraction grating G2. The phase difference $\phi$ between the wave D which is diffracted by the diffraction grating G2 and then by the diffraction grating G1 to travel in the direction opposite to the direction of the vertically incident wave (light) I and the wave D' which is diffracted by the diffraction grating G2 and then by the diffraction grating G1' to travel in the direction opposite to the direction of the wave I is measured by detecting the waves D and D' with detectors 4 and 5. The phase difference can be measured with various conventional devices such as a phase meter, a lock-in amplifier, an impedance meter or a counter in the time interval measurement mode. The phase difference $\phi$ is completely independent of the distance S between the objects 1 and 2, but is in proportion to the relative displacement x between the objects 1 and 2 in the direction (X direction) which is in parallel with the surfaces of the diffraction gratings G1, G1' and G2 and is perpendicular to the direction thereof. Thus, $\phi = 4\pi\, nx/d$ (radian), where n is the diffraction order. This relation is very simple as compared with the fact that the intensities of D and D' are dependent on the distance S and the relative displacement x.

Therefore, the value of the relative displacement x can be obtained by the measurement of the phase difference $\phi$ independently of the distance S. Furthermore, as the proportional coefficient n/d can be determined easily with a high degree of accuracy, the relative displacement x can be measured in the stationary state without causing the displacement of the objects in the X direction. When the frequency of the wave is less than tens GHz, the phase difference between the waves can be detected at a resolution less than 1° in a simple manner. Therefore, it is possible that the relative displacement x can be measured at a resolution less than d/720 so that as compared with the conventional methods for measuring the intensity of the wave, the measurement accuracy can be significantly improved.

In the second embodiment as shown in FIG. 3B, unlike the embodiment as shown in FIG. 3A, the diffraction grating G2 is formed on the object 1 while the diffraction gratings G1 and G1' are formed on the object 2. The wave I is made to fall on the diffraction grating G2 and the waves D and D' from the diffraction gratings G1 and G1', respectively, are received by the detectors 4 and 5, respectively, so that the measurement of the relative displacement x can be accomplished in a manner substantially similar to that described above.

(Second Embodiment 2)

Figure 4:
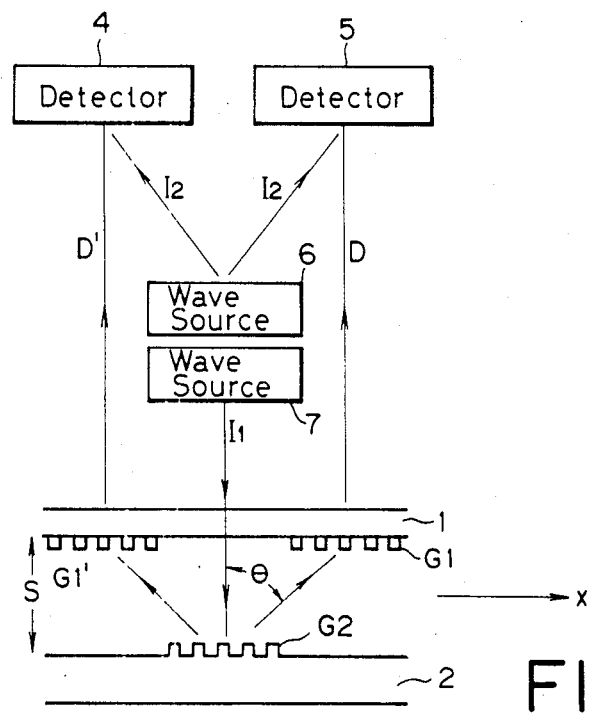
FIGS. 4–11 are schematic diagrams illustrating other embodiments of the present invention, respectively.

When the wave used for the measurement exceeds tens GHz, the direct measurement of the phase difference described above with reference to FIGS. 3A and 3B becomes difficult. Therefore, as shown in FIG. 4, two wave sources 6 and 7 are provided. The wave source 7 produces the wave $I_1$ (of a frequency $f_1$) which is made incident on the diffraction grating, while the wave source 6 produces the wave $I_2$ which has a frequency $f_2$ and can interfere with the wave $I_1$. The waves $I_2$ are made incident on the detectors 4 and 5 simultaneous with the waves D and D' so that the phase difference between the beat obtained by the superposition of the wave D and the wave $I_2$ and the beat obtained by the superposition of the wave D' and the wave $I_2$ is detected. In this case, the phase difference is obtained from the relation of $\phi = 4\pi n \cdot x/d$ as in the case of the embodiments described above with reference to FIGS. 3A and 3B. When the frequency $f_2$ is suitably selected, the frequency $|f_1 - f_2|$ of the beat can be dropped to a suitable value so that the value of the relative displacement x can be measured with a high degree of accuracy. This method is especially effective in the case of the measurement of an extremely small displacement with an accuracy of the order of nanometer by utilizing the light having the frequencies in the visible range.

Various conventional methods may be used to produce the wave $I_2$. In order to produce the wave up to a frequency of the order of hundreds GHz, an electric mixer may be used. Furthermore, in the case of light, the light which can interfere with the wave $I_1$ and has a different frequency can be produced by using electro-optical elements, accoustoptical elements, oscillating mirrors and quater-wave plates. A Zeeman laser, in which a laser medium is subjected to a magnetic field simultaneously produces two beam components which are different in polarization and frequency from each other but can interfere with each other and is very advantageously used in the method shown in FIG. 4.

(Embodiment 3)

Figure 5:
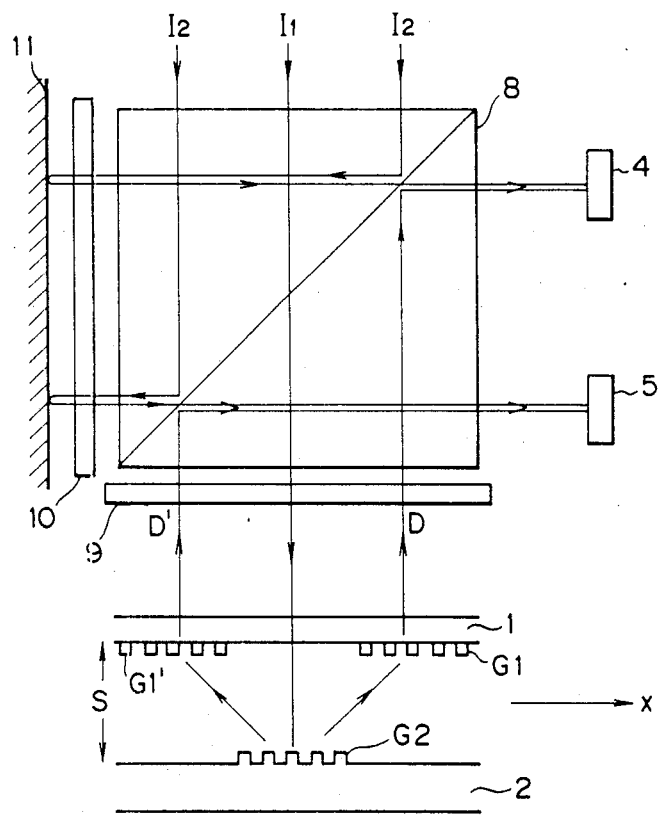

FIG. 5 shows a simplified construction of the embodiment described above with reference to FIG. 4, when light beams which can intefere with each other, are different in frequency and are linearly polarized in mutually perpendicular directions are obtained in a single luminous flux (as in the case of a lateral Zeeman laser). In FIG. 5, the light beam $I_1$ at a frequency $f_1$ is permitted to pass through a polarized beam splitter 8 and passes on the diffraction grating G2 through a quater-wave plate 9 while the light beam $I_2$ at a frequency $f_2$ is reflected by the polarized beam splitter 8 and reaches through a quarter-wave plate 10 to a flat mirror 11. The diffracted waves D and D' from the diffraction grating G2 are reflected by the polarized beam splitter 8 and falls on the detectors 4 and 5 together with the light $I_2$ reflected back from the flat mirror 11. The adjustment of the optical system of the third embodiment shown in FIG. 5 is easier than the second embodiment shown in FIG. 4.

(Embodiment 4)

Figure 6:
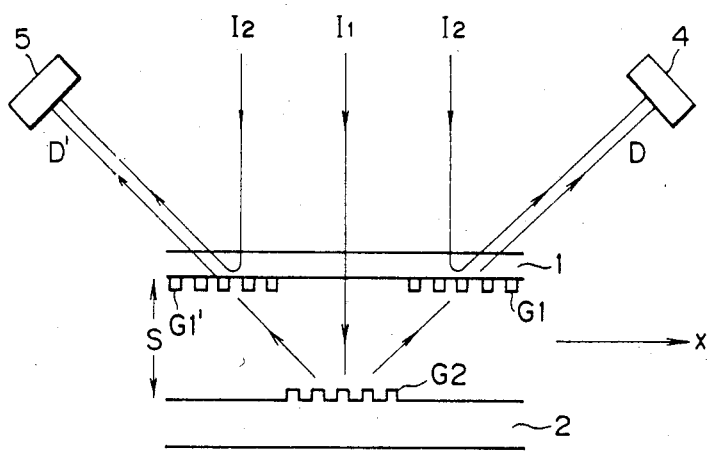

In the case of the embodiment as shown in FIG. 6, the arrangement of the diffraction gratings G1, G1' and G2 is substantially similar to that shown in FIG. 2. The wave $I_1$ at a frequency $f_1$ is made incident on the diffraction grating G2 while the wave $I_2$ at a frequency $f_2$ is made incident on the diffraction gratings G1 and G1'. It is not needed that the diffraction gratings G1, G1' and G2 have the same period and it suffices that the light beam $I_1$ diffracted by the diffraction grating G2 (period $d_2$) includes components whose directions coincide with the directions of the diffracted light beams $I_2$ diffracted by the diffraction gratings G1 and G1' (periods $d_1$ and $d_1'$, respectively). That is, it suffices to satisfy the relations $d_1/d_2 = m/n$ and $d'/d_2 = l/n$ (where l, m and n are integers). However, the lower order diffractions have a high diffraction efficiency so that it is preferable to set $d_1 = d_2 = d_1'$ in practice.

When the diffracted light beams D and D' are diffracted wave in which the diffracted light beam $I_1$ from the diffraction grating G2 and the light beams $I_2$ from the diffraction gratings G1 and G1', respectively, are superimposed one upon another, the intensities of the diffracted light beams D and D' produce the beat at a frequency $|f_1 - f_2|$. Thus, in this embodiment, the diffracted light beams D and D' are detected by the detectors 4 and 5, respectively, so that the phase difference $\phi$ between the beats of the diffracted light beams D and D' is detected. The phase difference $\phi$ and the relative displacement x in the X direction has the following relationship:

$$\phi = 4\pi nx/d_2$$

so that the relative displacement x can be measured with a high degree of accuracy by measuring the phase difference $\phi$ regardless of the distance S between the diffraction gratings G1 and G1' and the diffraction grating G2.

The embodiment shown in FIG. 6 has a feature that when $|f_1 - f_2|$ is selected significantly lower than $f_1$ or $f_2$, the phase difference $\phi$ becomes completely independent of the variations in distance between the diffraction grating G1 and the detector 4 and between the diffraction grating G1' and the detector 5. When the difference between the distance between the diffraction grating G1 and the detector 4 and the distance between the diffraction grating G1' and the detector 5 is designated by $\Delta L$, the phase difference caused by $\Delta L$ becomes $2\pi \Delta L |f_1 - f_2|/c$ (where c is the velocity of the wave) so that it becomes easy to make the value negligible when $|f_1 - f_2|$ is suitably selected. Therefore, the adjustment of the measuring system in this method can be significantly simplified as compared with the embodiments 1-3 and furthermore, this method is almost immune to the external disturbances.

In FIG. 6, when the light beam $I_2$ is made uniformly incident over the whole surface including the diffraction grating G2, the relative displacement x in the X direction can be measured in a manner substantially similar to that described above. However, the phase difference $\phi$ is in proportion to the relative displacement x only when x is considerably smaller than $d_2$. But, since the illumination or projection system can be made simple in construction, the above-described method is advantageous for the purpose of detecting x = 0 as in the case of the registration or alignment between the objects 1 and 2. In order to construct such illumination or light projection system, when, for instance, the linearly polarized light beams $I_1$ and $I_2$ are different in polarized direction, an optically anisotropic material is inserted into a light beam focusing system so that there is difference in optical path length between the light beams $I_1$ and $I_2$, whereby only the light beam $I_1$ is focused on the diffraction grating G2.

As in the case of the above, when the light beams $I_1$ and $I_2$ are the electromagnetic waves polarized in different directions, even when the light beam $I_2$ is made uniformly incident over the whole surface including the diffraction grating G2, the same effect as that obtained only when the diffraction gratings G1 and G1' are illuminated. To this end, a quater-wave plate and a polarizer are disposed in front of each of the detectors 4 and 5 so that the light beams $I_2$ are eliminated and does not reach the detectors 4 and 5. The polarized state of the diffracted wave varies depending upon the polarized state of the incident wave and the diffraction path so that only a specific diffracted component can be eliminated as described above.

(Embodiment 5)

Figure 7:
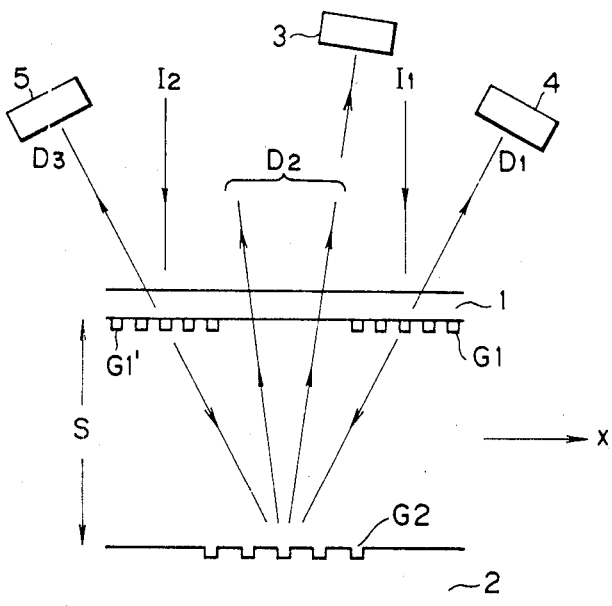

In the embodiment as shown in FIG. 7, the diffraction gratings G1 and G1' having the same period $d_1$ disposed on the object 1 and the wave $I_1$ at a frequency $f_1$ is made incident on the diffraction grating G1 while the wave $I_2$ at a frequency $f_2$ is made incident on the diffraction grating G1'. The diffraction grating G2 is disposed in parallel with the diffraction gratings G1 and G1' at a position where the diffracted light beams $I_1$ and $I_2$ in the same order from the diffraction gratings G1 and G1', respectively, strike. The period $d_2$ of the diffraction grating G2 is so selected as to be $d_2=d_1$ or $d_2=1.5\ d_1$, whereby the wave which is diffracted first by the diffraction grating G1 and then by the diffraction grating G2 and the wave which is diffracted first by the diffraction grating G1' and then by the diffraction grating G2 travel in the same direction. To this end, it is preferable to select $d_2/d_1=j/i$, where i and j are plus integers. In the case of $d_2=1.5\ d_1$, the wave which is diffracted by the diffraction grating G1 in the first order and then by the diffraction grating G2 in the minus first order and the wave which is diffracted in the minus first order by the diffraction grating G1' and then by the diffraction grating G2 in the second order become the waves which travel in the same direction. However, when $d_2$ is an integer multiple of $d_1$, the diffracted wave from the diffraction grating G1 is diffracted by the diffraction grating G2 and then returned again to the diffraction grating G1 so that the mutual dependence of the relative displacement obtained by the measurement becomes complicated. Therefore, it is preferable that $d_2$ be a noninteger multiple of $d_1$.

In this embodiment, as shown in FIG. 7, at least three diffracted waves $D_1$, $D_2$ and $D_3$ produce a beat at a frequency $|f_1-f_2|$ and the phase difference between the beats is given by $$\phi(D_2)-\phi(D_1)=\tfrac{1}{2}\{\phi(D_3)-\phi(D_1)\}+(4\pi nx/d_1)$$

where $\phi(D_i)$ is the phase of the beat of Di; n is the diffraction order at G1 and G1'; and x is the relative displacement in the X direction. Therefore, the value of the relative displacement x can be obtained by the measurement of $\phi(D_2)-\phi(D_1)$ by the detectors 3 to 5. In this case, the detectors 3, 4 and 5 detect the diffracted waves $D_1$, $D_2$ and $D_3$, respectively.

The embodiment 5 has a feature that the construction of the illumination or projection system is simpler than that of the embodiment 4. It should be especially noted that when the light beams $I_1$ and $I_2$ are light beams linearly polarized in the different directions, respectively, the double luminous flux required in the embodiment 5 shown in FIG. 7 can be obtained only by passing them through a suitable double refraction plate.

(Embodiment 6)

Figure 8:
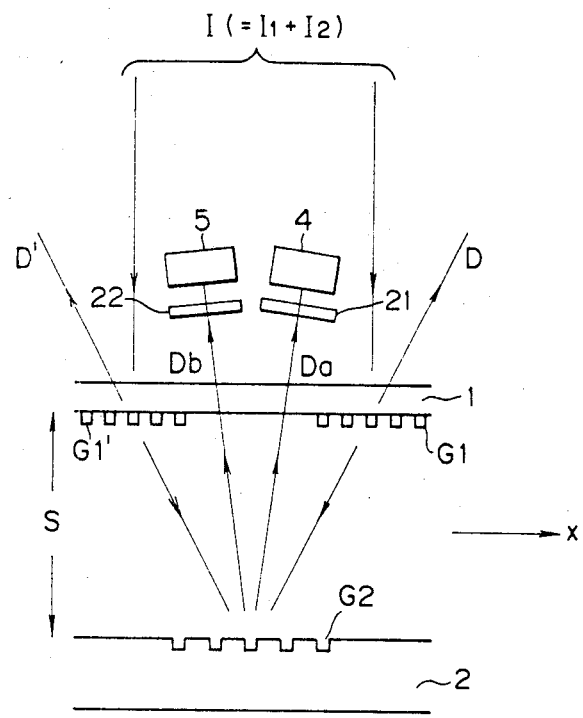

When the two waves $I_1$ and $I_2$ (at a frequency $f_1$ and at a frequency $f_2$, respectively) which are used in the measurement are the electromagnetic waves polarized in the different directions, respectively, the illumination or light projection measurement system needed for the measurement of the relative displacement can be significantly made simple in construction by utilizing the fact that the diffraction efficiency of a diffraction grating varies depending upon the polarized state of light. One example of such system is shown in FIG. 8. The construction and arrangement of the diffraction gratings G1, G1' and G2 are substantially similar to those shown in FIG. 7. The period $d_2$ of the diffraction grating G2 is not an integer multiple of $d_1$ and, for instance, is 1.5 $d_1$. When the electromagnetic waves $I_1$ and $I_2$ which are different in polarization and frequency from each other are combined to form a combined wave I which in turn is made to strike the measurement system, the combined wave Da obtained by the combination of the wave which is diffracted in the minus first order by the diffraction grating G1 and then in the second order by the diffraction grating G2 with the wave which is diffracted in the first order by the diffraction grating G1' and then in the minus first order by the diffraction grating G2, and the combined wave Db diffracted in the orders of opposite sign in relation to the combined wave Da are obtained. Da and Db thus obtained are made to strike the detectors 4 and 5, respectively, through polarizers 21 and 22 which polarize the light beams in suitable directions. Next, the phase difference between the beats in Da and Db is measured so that the relative displacement in the x direction between the objects 1 and 2 is measured. No diffraction grating is formed between the diffraction gratings G1 and G1' so that the major components of the diffracted wave I from the diffraction grating G2 will not be made to strike the diffraction gratings G1 and G1'. The embodiment as shown in FIG. 8 may be so modified that the diffraction gratings G1 and G1' are formed on the object 2 while the diffraction grating G2 is formed on the object 1 so that the light beam I is made incident first on the diffraction grating G2.

The reason why the value x can be obtained by the above-described method will be described. When the complex amplitude diffraction efficiency of the light beam $I_1$ at G1'→Da and the diffraction efficiency at G1'→Da of the light beam $I_1$ which are measured in the direction determined by the polarizer 21 are designated by $\gamma_1$ and $\gamma_1\ \alpha$, respectively, while those of the light beam $I_2$ measured by a manner similar to that described above are designated by $\gamma_2$ and $\gamma_2\beta$, the amplitude A(Da) of Da is given by $$A(Da)=\gamma_1(e^{-i\delta}+\alpha e^{i\delta})A_1+\gamma_2(e^{-i\delta}\beta e^{i\delta})A_2$$

where $A_1$ and $A_2$ are the amplitudes, respectively, of $I_1$ and $I_2$ on the diffraction gratings G1 and G1' and $\delta=2\pi x/d_1$. In general, the diffraction efficiency varies depending upon the polarized state so that except the case of a high degree of symmetry such as both $I_1$, and $I_2$ are circularly polarized light, $\alpha\neq\beta$. The amplitude of Db is equal to a value obtained when $\delta\rightarrow-\delta$ in A(Da). It follows therefore that the phases of the beats of Da and Db vary depending upon the value of δ and the phase difference is given by $$\phi(Db) - \phi(Da) = 2 \arctan \frac{(\alpha - \beta) \sin 2\delta}{1 + \alpha\beta + (\alpha + \beta) \cos 2\delta}$$

and the value x can be determined by this measurement.

In practice, it is highly practicable when the directions of polarization of $I_1$ and $I_2$ are mutually perpendicular. In this case, for instance, the direction of polarization of $I_1$ is aligned with the direction of the diffraction grating while $I_2$ is polarized in the direction perpendicular to the direction of polarization of $I_1$. Then, the phase difference $\phi(Db)-\phi(Da)$ becomes independent of the directions of the polarizers 21 and 22 disposed in front of the detectors 4 and 5. It is also easy to select the direction in which the highest degree of measurement accuracy is obtained by rotating the directions of polarization of $I_1$ and $I_2$.

The value x can be obtained with a high degree of accuracy independently of the distance S between the objects 1 and 2 by the method of FIG. 8. According to this method, the illumination or light projection system is simple in construction so that its adjustment may be much facilitated. As a result, the measurement is not adversely affected by external disturbances and a high stability can be ensured. Furthermore, this method has a feature that the adjustments required for measurement can be accomplished by the measurements of the phase difference between the beats of the diffracted waves D and D'. The phases difference between the beats of D and D' are independent of the value x, but vary in response to the parallelism between the diffraction gratings G1 and G1' on the one hand and the diffraction grating G2 and the verticality of I in relation to the surface of the diffraction grating. It follows therefore when the parallelism between the diffraction gratings G1 and G1' on the one hand and the diffraction grating G2 on the other hand and the inclination of I are adjusted, so that the phase difference is minimized the adjustments required for the measurement of x can be accomplished. These adjustments are highly effective in the improvement of a degree of measurement accuracy.

The fact that the measurement can be made with a high degree of accuracy in practice can be confirmed from the following example. Thin Au films are formed in the form of a grid on the object 1 consisting of $SiO_2$, thereby defining the diffraction gratings G1 and G1' and grooves of a width 0.4 μm are cut through the surface of the object 2 consisting of Si, thereby defining the diffraction grating G2. The period of the diffraction gratings G1 and G1' is 0.8 μm and the diffraction gratings G1 and G1' are spaced apart from each other by 75 μm. The period of the diffraction grating G2 is 1.2 μm. The laser beam at the wavelength of 632.8 nm is emitted from an He-Ne transverse Zeeman laser in such way that the laser beam is vertically incident on the diffraction gratings The beat frequency is about 300 KHz. The direction of polarization of one of two linearly polarized light beams is made to coincide with the direction of the diffraction grating and the polarizer is inserted in front of the detector in the direction of 45° in relation to the direction of the diffraction grating. In this case, the values of α and β become almost equal to 0.5 and 0.6, respectively, so that the phase difference between the beats of Da and Db can be measured with an accuracy higher than 1°, whereby the value x can be determined with an accuracy of the order of 0.01 μm. This characteristic or effect can be attained regardless of the variations in distance between the objects 1 and 2 from 20 μm to 70 μm.

(Embodiment 7)

Figure 1:
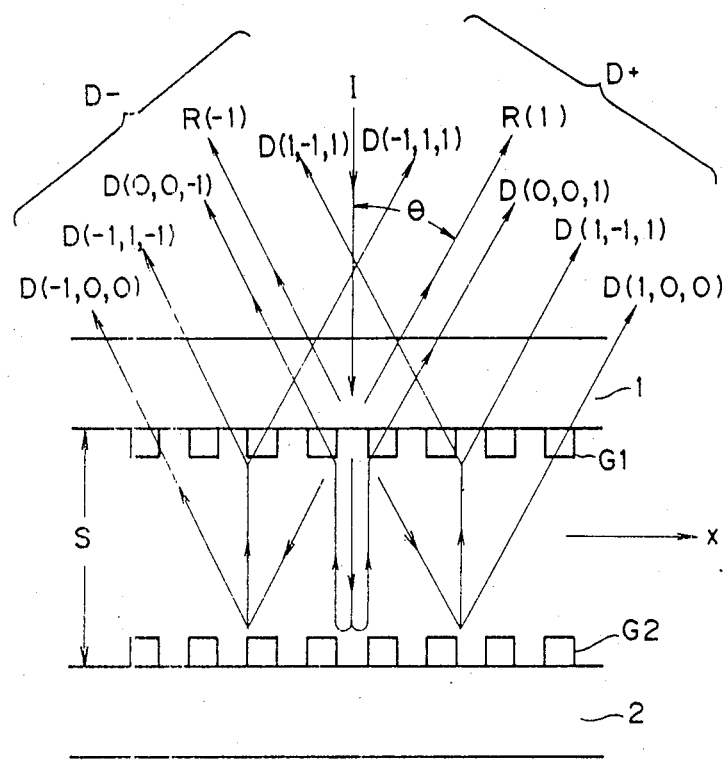
FIGS. 1 and 2 are schematic diagrams used to explain two conventional methods, respectively.
Figure 9:
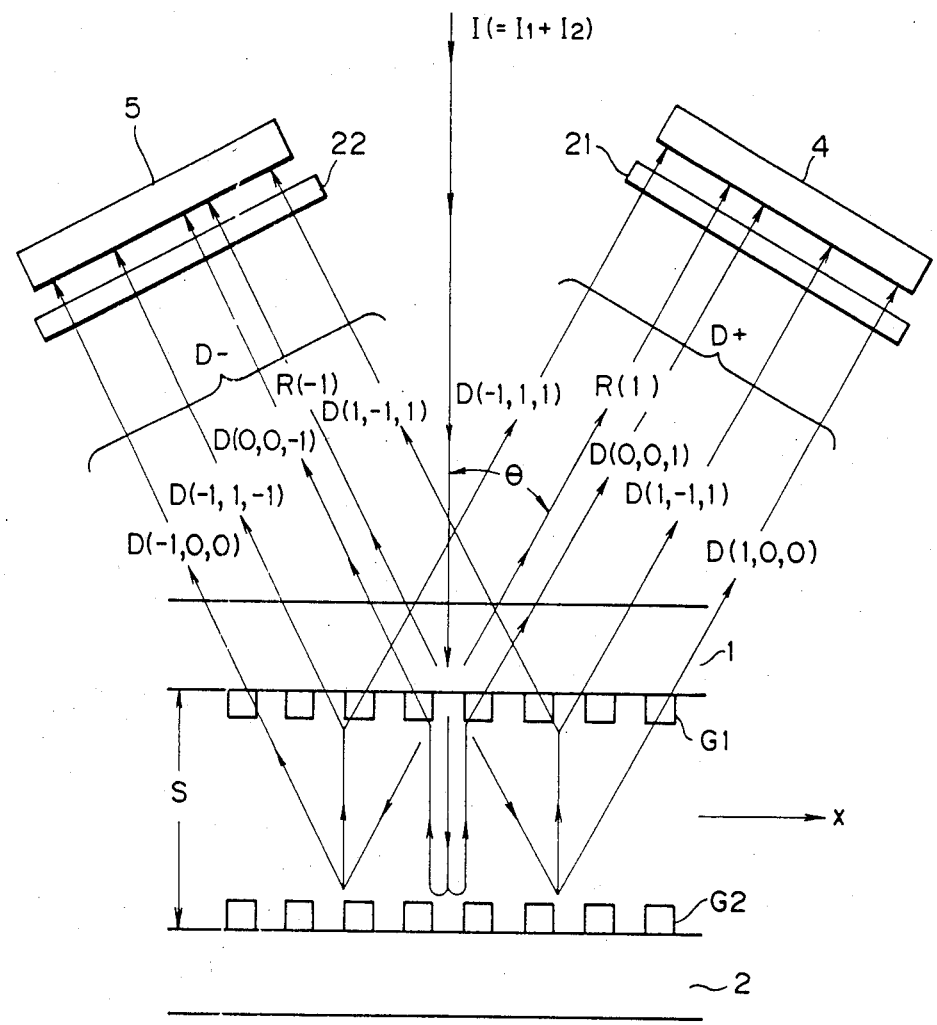

FIG. 9 shows the application of the method of the present invention to the conventional system as shown in FIG. 1. When it is assumed that D+ and D− are diffracted only in the first order by the diffraction grating G2 and when the amplitude of the incident wave is designated by $A_0$, the amplitudes A+ and A− of D+ and D− are expressed by $$A+ = \gamma(1+\alpha e^{-i\delta}+\beta e^{i\delta})A_0$$

and $$A- = \gamma(1+\alpha e^{i\delta}+\beta e^{i\delta})A_0$$

where, γ, α and β are the complex amplitude diffraction efficiency of a double diffraction grating, respectively, and their phases are complicated functions of the distance S between the diffraction gratings G1 and G2. Furthermore, $\delta=(2\pi x)/d$, where d is the period of the diffraction gratings. In this case, the difference in intensity between two diffracted waves is expressed by $$I(D+)-I(D-)=4|\gamma|^2 Im\{(\alpha-\beta)\sin\delta+\alpha\beta\sin 2\delta\}|A_0|^2,$$

where Im shows an imaginary part. It follows therefore that the dependency of $I(D+)-I(D-)$ on δ or x is determined by the values of the imaginary parts of α and β. The imaginary parts of α and β sharply vary in response to the distance S between the objects 1 and 2 so that the prior art method shown in FIG. 1 is greatly affected by variations in S.

However, when the method in accordance with the present invention is applied to the system as shown in FIG. 9, the characteristics can be improved because of the reasons to be described below. When the incident wave I is the sum of two electromagnetic waves $I_1$ and $I_2$ which are different in frequency and polarized state from each other, the intensities of D+ and D− produce beats. In this case, when the polarizers 21 and 22 are disposed in front of the detectors 4 and 5, respectively, higher intensity of beats can be obtained.

When the complex amplitude diffraction efficiencies of $I_1$ and $I_2$ are designated by $\gamma_1$, $\alpha_1$ and $\beta_1$ and $\gamma_2$, $\alpha_2$ and $\beta_2$, the phase difference between the beats in D+ and D− becomes almost in proportion to $\alpha_1-\alpha_2^*+\beta_1-\beta_2^*$ when δ is sufficiently smaller than 1. As compared with the imaginary parts of α and β, the dependency of this value on S is considerably small. It follows therefore that the measurement of x can be accomplished over the wide range of S by the measurement of the phase difference between the beat components of D+ and D−. Furthermore, as compared with the intensity measurement, the phase measurement is less affected by variations in external factors so that a high degree of measurement accuracy can be ensured.

In practice, the method in accordance with the present invention can attain the following remarkable improvement of characteristics. A thin Au film is formed in the form of a grid on the object 1 consisting of $SiO_2$, thereby defining the diffraction grating G1 while grooves of a width 0.4 μm are cut in the surface of the object 2 consisting of Si, thereby defining the diffraction grating G2. The period of both the diffraction gratings G1 and G2 is 1 μm. As in the case of the embodiment 6, the incident wave I is the laser beam emitted from an He-Ne transverse Zeeman laser and component light rays are polarized in the directions of the diffraction grating and perpendicular to the direction thereof. In the case of the prior art method shown in FIG. 1, in order to measure the relative displacement in the X direction, the distance S between the diffraction gratings G1 and G2 must be determined at some suitable value (for instance, 22.23 μm) which in turn is determined by the wavelength of the incident light I and the period of the diffraction gratings G1 and G2, within an tolerable error of less than 10 nm. Therefore, it has been almost impossible to use this prior art method in practice. However, according to the embodiment 7 of the present invention, the limitation of S is substantially eliminated and it becomes possible to measure the relative displacement in the X direction with an accuracy higher than 0.05 μm over the wide range of the distance S between 10–100 μm except some specific values; that is, $\pm 0.1$ μm adjacent to the value $S(\theta=39°$ is a diffraction angle) where $S(\cos\theta-1)$ is an integer multiple of a half wavelength.

(Embodiment 8)

Figure 10:
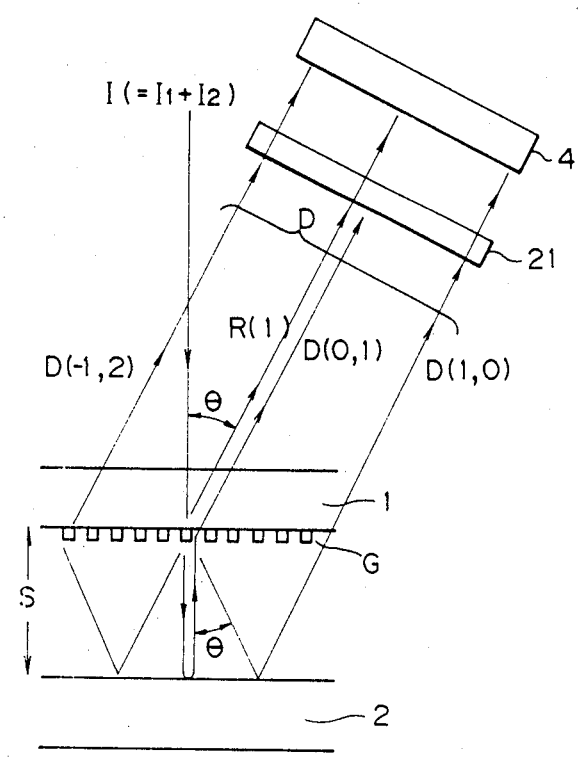

FIG. 10 shows the application of the method in accordance with the present invention to the measurement of the relative displacement in the direction perpendicular to the surface of the diffraction grating. As shown in FIG. 10, one object 1 of two objects disposed in parallel with each other is formed with the diffraction grating G and the electromagnetic wave I is made to vertically strike the surface of the diffraction grating G. In this case, the diffracted wave D is the combination of the wave diffracted reflectively from the upper surface of the diffraction grating G, the wave diffracted by the diffraction grating G and then reflected from the object 2 and the wave reflected from the object 2 and then diffracted by the diffraction grating G.

According to the prior art methods, the intensity of D is measured, thereby determining the distance S between the object 1 and 2 so that in order to specify the distance S at a predetermined value, it is required to vary S, thereby varying the intensity of D. Furthermore, the measurement is easily affected by variations in the intensity of the incident wave so that the measurement accuracy is limited to $\lambda/20$ (where $\lambda$ is the wavelength of I).

It is easy to improve the measurement accuracy by applying the method of the present invention to the example shown in FIG. 10. That is, the incident wave I is the electromagnetic wave having two components $I_1$ and $I_2$ which are different in frequency and polarized state from each other. That is, $I=I_1+I_2$. And the diffracted wave D is detected by the detector 4 so as to measure the phase of the beat component. When the polarizer 21 is inserted in front of the detector 4 and is oriented in any suitable direction, it becomes possible to obtain a strong beat.

The measurement of the phase can be performed by utilizing a reference signal, as a reference, which is coherent with the beat resulting from the interference between two components $I_1$ and $I_2$ constituting the incident wave I.

In the case that a Zeeman laser is used as a source of the incident wave I, a beat signal outputted from a controller of the Zeeman laser can be used as a reference signal. (All Zeeman lasers on the market have an output of a beat signal.)

In the case that the incident wave I is produced by utilizing a modulation method of an acoustooptical element, an electrooptical element, an oscillating mirror and so on to which a modulation signal is applied to modulate the element, the modulation signal can be sued as a reference signal.

In another way, the incident wave I is split with a half mirror before it is incident to the diffraction grating G, so that a beat of the split part of the incident wave I is detected by another detector (not shown), and then the beat may be used as a reference signal.

The reason why the distance S is measured in the manner described above is as follows D is a combined diffracted wave consisting of $D(0,1)$, $D(1,0)$, $D(-1,2)$ and so on each having a different optical path. The diffracted components have each different dependency of the amplitude diffraction efficient on the polarized state. The electromagnetic wave which is reflected by the object 2 and then diffracted by the grating G has a phase lag depending upon the distance S and each diffracted component has a different phase lag. As a result, the dependency of the phase lag on the distance S of each of the $I_1$ and $I_2$ components constituting the diffracted wave D is different so that the beat phase varies depending upon the distance S.

When the beat phase is measured with an accuracy of the order of 1° by the method in accordance with the present invention, the distance S can be measured easily with a high degree of accuracy in excess of $\lambda/100$.

(Embodiment 9)

Figure 11:
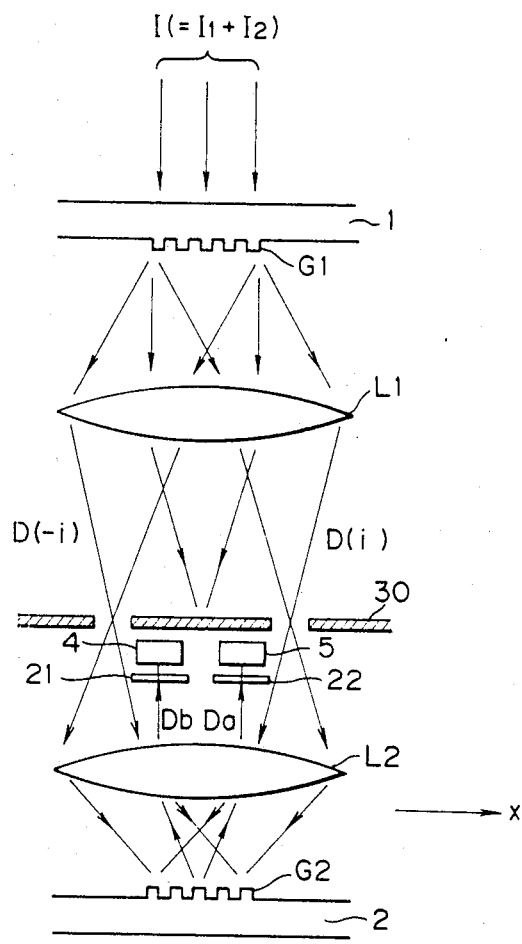

In the above-described embodiment 6, an optical system such as lenses can be interposed between the two objects. In FIG. 11, the image of the diffraction grating G1 (with a period $d_1$) on the object 1 is focused through lens systems L1 and L2 on the diffraction grating G2 (with a period $d_2$) on the object 2. For instance, the period $d_1'$ of the image of the diffraction grating G1 focused on the object 2 is so selected that $d_2/d_1'=1.5$. The combined wave I consisting of light beams $I_1$ and $I_2$ which are different in frequency and polarized state from each other is made to vertically strike the surface of the diffraction grating G1. In addition, a suitable space filter 30 is disposed on the focal plane of the lens system L1 so that the waves which are diffracted in suitable orders (for instance, $\pm$first orders) are only permitted to pass through the filter 30 and focused on the object 2.

In this system, based on the same underlying principle as that described with reference to the embodiment 6, the phase difference between the beats in the diffracted waves Da and Db from the diffraction grating G2 is measured by the detectors 4 and 5 so that the relative displacement in the directions of the surfaces of the diffraction gratings on the objects 1 and 2 (in the X direction in FIG. 11) can be measured. The measurement of the relative displacement in the manner described above can be accomplished without almost adversely affecting a degree of measurement accuracy even when the image of the diffraction grating G1 is not sharply focused on the diffraction grating G2 and is focused in front of or behind thereof. Even when a projection optical system such as a concave mirror is used instead of lenses, the relative displacement can be measured in a manner substantially similar to that described above.

The embodiment 9 described above is very effective in attaining the alignment or registration with a high degree of accuracy between a reticle and a semiconductor wafer in the reduction projection exposure devices used widely in the production of VLSIs. Even when the diffraction gratings G1 and G2 are not parallel with each other, the method of the present invention can be easily applied by utilizing suitable optical systems. Furthermore, when optical fibers for preserving the polarization direction are inserted into an optical projection system, it becomes possible to space apart the diffraction gratings G1 and G2 from each other by any suitable distance. As described above, the embodiment 9 described above can measure the relative displacement with a high degree of accuracy even when the objects are arranged in various manners.

As described in detail hereinbefore, the present invention can be applied to various methods for measuring the relative displacement by utilizing the diffraction effect of the wave attained by the diffraction gratings and can greatly improve the characteristics of the measuring methods. In the embodiments described above, the present invention has been described in conjunction with the relative displacement between two objects, but it is to be understood that the methods in accordance with the present invention can be suitably combined so that the relative displacements among three or more objects can be easily measured. Therefore the present invention can be applied in a wide industrial field where the measurement of the relative displacement with a high degree of accuracy is required. Especially, the present invention is very effective when it is applied to the measurement of the relative displacement between an exposure mask and a semiconductor wafer in the lithographic processes widely used in the production of electronic devices.

What is claimed is:

1. A relative-displacement measurement method comprising the steps of:
    forming a diffraction grating on one of two objects which are overlapped in parallel with each other;
    generating the waves which are different in frequency and polarized state from each other, incident to said diffraction grating, thereby obtaining firstly diffracted waves;
    making said firstly diffracted waves and/or waves passing through said diffraction grating incident to the other object not formed with a diffraction grating, thereby obtaining reflected light beams;
    diffracting said reflected light beams by said diffraction grating, thereby obtaining the secondary diffracted waves; and
    measuring a phase of beat component of a combined wave of reflectively diffracted light beams of the wave incident to said diffraction grating and said firstly and secondary diffracted waves relative to the beat that is created by interference between said incident waves having different frequencies, thereby obtaining a distance between said two objects from said phase thus measured.

2. A relative-displacement measurement method as claimed in claim 1, wherein said combined wave is made to pass through a polarizer so as to obtain the beat of the output light beam therefrom.

3. A relative-displacement measurement method comprising the steps of:
    forming at least one diffraction grating on each of two objects;
    making two waves which can interfere with each other but are different in frequency from each other incident to said diffraction gratings, thereby obtaining at least two diffracted waves; and
    measuring a phase difference between beats generated in said diffracted waves resulting from an interference among said two waves having different frequencies, thereby obtaining relative displacement among said two objects based on the phase difference in said beats thus measured.

4. A relative-displacement measurement method as claimed in claim 3, wherein said two waves are electromagnetic waves which are different in polarized state from each other.

5. A relative-displacement measurement method as claimed in claim 4, wherein said electromagnetic waves are combined to form a single wave and made incident to said diffraction gratings.

6. A relative-displacement measurement method as claimed in claim 4, wherein said electromagnetic waves are linearly polarized in different directions, respectively.

7. A relative-displacement measurement method as claimed in claim 6, wherein two of three diffraction gratings are formed on one object, and one of three diffraction gratings is formed on the other object.

8. A relative-displacement measurement method as claimed in claim 7, wherein a period of the diffraction grating formed on one object is $j/2i$ times that of the diffraction grating formed on the other object, where $i$ and $j$ are positive integers.

9. A relative-displacement measurement method as claimed in claim 4, wherein said obtained diffraction wave is made to pass through a polarizer so as to detect the beats of the output light beam from said polarizer.

10. A relative-displacement measurement method as claimed in claim 3, wherein two of three diffraction gratings are formed on one object, and one of three diffraction gratings is formed on the other object.

11. A relative-displacement measurement method as claimed in claim 10, wherein said three diffraction gratings are arranged symmetrically.

12. A relative-displacement measurement method as claimed in claim 10, wherein a period of the diffraction grating formed on one object is $j/2i$ times that of the diffraction grating formed on the other object, where $i$ and $j$ are positive integers.

13. A relative-displacement measurement method as claimed in claim 12, wherein the period of the diffraction grating formed on one object is 1.5 times that of the diffraction grating formed on the other object.

14. A relative-displacement measurement method as claimed in claim 3, wherein an optical system is interposed between said two objects.

15. A relative-displacement measurement method as claimed in claim 14, wherein said optical system includes a first lens, a second lens and a space filter disposed at a focal plane of said first lens.

16. A relative-displacement measurement method as claimed in claim 3, wherein said two objects are disposed in parallel with each other.

17. A relative-displacement measurement method as claimed in claim 16, further comprising the steps of obtaining at least two diffracted waves in addition to said diffracted waves used for the reference displacement; and measuring the phase difference in the beats of said diffracted waves, thereby determining a verticality of the wave incident in relation to the surface of the diffraction gratings.

18. A relative-displacement measurement method comprising the steps of:

forming at least one diffraction grating on each of two objects;

generating two waves which can interfere with each other but are different in frequency;

making one of said two waves incident to said diffraction gratings, thereby obtaining at least two diffracted waves;

generating beats by making said diffracted waves interfere with the other of said two waves having a different frequency; and measuring a phase difference between said beats in said diffracted waves, thereby obtaining relative displacement among said objects based on the phase difference in said beats thus measured.

19. A relative-displacement measurement method as claimed in claim 18, wherein said two waves are electromagnetic waves having different polarization directions; said electromagnetic waves are transmitted through a polarizing beam splitter in such a way that the transmitted electromagnetic waves are made incident to said diffraction gratings through a quarter-wave plate; a reflected light beam is redirected through a quarter-wave plate and a reflecting mirror to said polarizing beam splitter; and the diffracted light beams from said diffraction gratings and the reflected light beam redirected to said polarizing beam splitter are combined and derived from said polarizing beam splitter, thereby generating said beats and detecting said phase difference.

* * * * *